United States Patent [19]

Gelorme et al.

[11] Patent Number: 4,615,763

[45] Date of Patent: Oct. 7, 1986

[54] ROUGHENING SURFACE OF A SUBSTRATE

[75] Inventors: Jeffrey D. Gelorme, Binghamton; William H. Lawrence, Greene; Peter Slota, Jr., Vestal, all of N.Y.

[73] Assignee: International Business Machines Corporation, Armonk, N.Y.

[21] Appl. No.: 688,388

[22] Filed: Jan. 2, 1985

[51] Int. Cl.$^4$ .......................... B44C 1/22; C03C 15/00; C03C 25/06; B29C 17/08
[52] U.S. Cl. .................................. 156/643; 156/646; 156/655; 156/668; 156/902; 252/79.1; 427/96; 427/98; 427/307
[58] Field of Search ............... 156/643, 646, 655, 668, 156/902; 252/79.1; 427/96, 98, 307

[56] References Cited

U.S. PATENT DOCUMENTS

| | | | |
|---|---|---|---|
| 2,663,663 | 12/1953 | Weltman et al. | 154/121 |
| 3,625,758 | 12/1971 | Stahl et al. | 117/212 |
| 3,795,557 | 3/1974 | Jacob | 156/8 |
| 3,801,427 | 4/1974 | Morishita et al. | 161/162 |
| 3,884,771 | 5/1975 | Hanabusa et al. | 204/12 |
| 3,978,252 | 8/1976 | Lombardo et al. | 427/299 |
| 4,113,899 | 9/1978 | Henry et al. | 427/290 |
| 4,147,564 | 4/1979 | Magee et al. | 148/1.5 |
| 4,152,477 | 5/1979 | Haruta et al. | 428/209 |
| 4,180,432 | 12/1979 | Clark | 156/643 |
| 4,216,246 | 8/1980 | Iwasaki et al. | 427/43.1 |
| 4,281,038 | 7/1981 | Ambros et al. | 428/131 |
| 4,283,249 | 8/1981 | Ephrath | 156/643 |
| 4,325,991 | 4/1982 | Donovan | 156/668 X |
| 4,469,777 | 9/1984 | O'Neil | 156/902 X |

OTHER PUBLICATIONS

IBM Technical Disclosure Bulletin, vol. 26, No. 2, Jul. 1983, Method of Improving the Adhesive of Copper on a Plastic Laminate, H. Bohlen, pp. 673–674.
Robin H. Wheater et al., "Polymer Interlayer Adhesion Enhancements Through Plasma Surface Modification".

*Primary Examiner*—William A. Powell
*Attorney, Agent, or Firm*—Pollock, Vande Sande & Priddy

[57] ABSTRACT

The surface of a substrate is roughened by providing a substrate which comprises a resinous material and an inorganic particulate material; and etching a surface of the substrate to selectively etch the resinous material and thereby produce the roughened surface.

19 Claims, No Drawings

ROUGHENING SURFACE OF A SUBSTRATE

DESCRIPTION

1. Technical Field

The present invention is concerned with a method for roughening the surface of a substrate and is particularly concerned with a substrate which comprises a resinous material. The present invention is especially concerned with roughening the surface of so-called prepreg substrates.

2. Background Art

A number of fiber reinforced plastics are used commercially for various purposes. Articles such as sheets, tapes, or fabrics wherein fibers are impregnated with a resin such as an epoxy resin or an unsaturated polyester resin are referred to as "prepreg substrates". One important use of prepreg substrates is to provide a surface upon which a pattern of an electrical conductor can be provided to obtain circuit boards or circuit cards. The desired pattern of the electrical conductor can be provided by, for instance, electroless plating of metal such as copper and nickel onto the substrate. Such technique is well-known in the prior art. For instance, an electroless or autocatalytic copper plating bath usually contains a cupric salt, a reducing agent for the cupric salt, a chelating or complexing agent, and a pH adjustor. Moreover, if the surface being plated is not already catalytic for the deposition of the desired metal, a suitable catalyst is deposited on the surface prior to contact with the plating bath. Among the more widely employed procedures for catalyzing a substrate is the use of a stannous chloride sensitizing solution and a palladium chloride activator to form a layer of metallic palladium particles.

After the substrate is sensitized with the catalyst or seeder, the desired circuit pattern is defined by conventional photosensitive processes. For instance, a photosensitive material such as a negative photoresist can be applied to the substrate and then, by use of a mask, the photosensitive material is subjected to light of suitable wavelength to cause crosslinking or curing thereof. Next, unexposed photosensitive material is removed by treating with a chemical such as methylchloroform in areas where the circuitry is to be plated. The areas in which the photosensitive material is removed are those areas where the circuitry is to be plated.

After this, the metal such as nickel or copper is plated, preferably by electroless plating onto those preselected areas of the dielectric substrate which do not contain the photosensitive material. The metal is coated to the desired thickness of the circuitry.

However, in order to provide adequate adhesion of the catalyst and of the photosensitive material to the dielectric substrate, an irregular surface can be created on the dielectric substrate which, in turn, provides for improved bonding sites for the subsequently plated additive metal. A commonly used method to create an irregular surface on the dielectric substrate is a process which has been referred to as a sacrificial metal layer process.

Briefly, such process includes laminating a sheath or film of a metal such as copper, nickel, or aluminum onto the surface of the dielectric substrate. The metal film is then stripped or etched completely from the substrate prior to application of any circuitry. This technique creates an irregular surface on the dielectric substrate which, in turn, provides the improved bonding sites for the subsequently plated metal. The film which is laminated to the substrate is textured and, during the lamination, the resinous material of the prepreg flows, generating the reverse image of the textured surface. Upon wet chemically etching-off the metal film, the reverse texture topography of the film is exposed in the prepreg.

A disadvantage of this process is the requirement of employing a wet chemical etching process. The disadvantages which accompany wet chemical etching processes include control of the etching composition, requirements of caution in handling the compositions, and care in disposal of spent etchants and relative high cost involved. In addition, wet chemical processing can lead to loss in insulation resistance due to residual ionic contaminants from the wet chemical process.

An alternative way to fabricate circuit boards involves encapsulating insulated wires in an adhesive. The resulting circuit board is generally termed an encapsulated wire circuit board. Encapsulated wire circuit boards are commercially available under the trade designation "Multiwire" which is owned by the Kollmorgen Corporation. The encapsulated wire technique is shown in U.S. Pat. Nos. 4,097,684 to Burr; 3,646,772 to Burr; 3,674,914 to Burr; and 3,674,602 to Keough.

U.S. patent application Ser. No. 392,996 filed June 28, 1982, by Varker, entitled "High Density Encapsulated Wire Circuit Board", disclosure of which is incorporated herein by reference, describes a technique for making an encapsulated wire circuit board wherein the insulated wires are firmly bonded to a relatively thick layer of copper which is covered by a layer of prepreg. The expansion and contraction of the board during thermal cycling is controlled by the copper and, therefore, there is not any significant amount of unpredictable variations in the dimensions of the board. Holes can be very accurately drilled at precise locations in such boards. In the technique shown in said Varker application, insulated wires are bonded to a substrate utilizing a heat curable adhesive so that after the adhesive is cured, the wires can not move relative to the substrate.

U.S. patent application Ser. No. 392,998 filed June 28, 1982, entitled "Process for Making an Encapsulated Circuit Board and Products Made Thereby", by Grant, et al., disclosure of which is incorporated herein by reference, describes an improvement of the circuit board and process described in said Varker application. The Grant, et al. application describes the fabrication of an encapsulated wire board using a photosensitive such as a photo-curable adhesive material. In the technique described in the Grant, et al. patent application, the wires are laid in a photosensitive adhesive, this adhesive is exposed to light, thereby curing the adhesive and firmly bonding the wires to the substrate. The Grant, et al. patent application describes the use of the material described in U.S. Pat. No. 4,169,732 to Shipley.

However, in order to enhance the adhesion of the photosensitive material to the prepreg, an irregular surface can be created on the surface of the prepreg. A commonly used method to create an irregular surface on the dielectric prepreg substrate is the sacrificial metal layer process discussed hereinabove. The disadvantages of the wet chemical etching process are also discussed hereinabove. Accordingly, it would be desirable to provide a roughening process which does not require wet chemical etching and does not have the disadvantages associated with wet chemical etching.

SUMMARY OF THE INVENTION

The present invention makes it possible to provide good adhesion of the photosensitive material to the dielectric substrate. In addition, the good adhesion of the photosensitive material made possible by the present invention can be achieved without employing a sacrificial metal layer. In addition, such good adhesion of the photosensitive material can be achieved without employing wet chemical processing and the various undesirable aspects associated with wet chemical processing.

The present invention provides a method for roughening the surface of a substrate. The present invention includes providing a substrate which comprises a resinous material and an inorganic particulate material. The substrate is etched by a method which selectively etches the resinous material, thereby providing a roughened surface. The resinous material is removed while inorganic particulate material remains and is left exposed. The surface topography of the surface of the substrate will assume the features such as particle size and shape of the exposed inorganic particulate material.

BEST AND VARIOUS MODES FOR CARRYING OUT THE INVENTION

The substrate, roughened in accordance with the present invention, comprises a resinous material which can be thermoplastic or thermosetting and, particularly, those thermoplastic and thermosetting polymers which are useful in preparing dielectric substrates useful in the preparation of integrated circuit modules such as high density circuit boards. Typical thermosetting resinous materials include epoxy, phenolic based materials, and polyamides. Such materials are usually molded articles of the resinous material along with a reinforcing agent such as being a glass-filled epoxy or phenolic based material. Examples of some phenolic-type materials include copolymers of phenol, resorcinol, and cresol. Examples of some suitable thermoplastic polymeric materials include polyolefins such as polypropylene, polysulfones, polycarbonates, nitrile rubbers, and ABS polymers. The preferred polymeric materials employed in accordance with the present invention are the epoxy resinous materials. Typical epoxy resins include the bisphenol A type resins obtained from bisphenol A and epichlorohydrin, resinous materials obtained by the epoxidation of novolak resins produced from a phenolic material such as phenol and an aldehyde such as formaldehyde with epichlorohydrin, polyfunctional epoxy resins such as tetraglycidyldiaminodiphenyl methane, and alicyclic epoxy resins such as bis (3,4-epoxy-6-methyl-cyclohexylmethyl) adipate. The most preferred epoxy employed is of the bisphenol A type.

In accordance with the present invention, it is essential that the substrate also include an inorganic particulate material such as $SiO_2$, $CaCO_3$, $Al_2O_3$, $CaO_2$, SiC, and $CaF_2$. The preferred inorganic particulate material is silica ($SiO_2$). In addition, the inorganic particulate material can be a mixture such as talc, clay, siliceous stone, diatomaceous earth, pyrosclerite, fluorite, dolomite, sericite, kaolin, and glass.

The most preferred inorganic particulate materials include all forms of silica such as fused silica, available under the trade designation Cabosil, and hollow silica particles including hollow glass beads.

In addition, if desired, the inorganic particulate material can contain an additional coating or coupling agent in order to enhance adhesion of the subsequently applied metal, such as copper, to the substrate. Suitable coupling agents include those containing amine functionality. Examples of such coupling agents include silanes having the general formula:

wherein R' is a hydrocarbon radical and preferably, an alkyl radical of 1–6 carbon atoms and R is an amine-substituted alkyl radical in which the alkyl groups have from 1–6 carbon atoms. Examples of some commercially available silanes are Union Carbide A-1100 (gamma amino propyl trimethoxy silane); and Union Carbide A-1120 (N-beta(aminoethyl)-gamma-amino propyl trimethoxy silane).

Such coupling agents can be provided onto the inorganic particulate material by vapor deposition.

The inorganic particulate material is preferably an aggregate of fused spherical particles and has an aggregate size of about 0.002 to about 10 microns, and most preferably, about 0.01 to about 1 micron.

The amount of the inorganic particulate material is about 1% to about 10% by weight, and preferably, about 4% to about 8% by weight of the total of the resinous material and inorganic particulate material.

The epoxy resinous compositions also can contain accelerating agents and curing agents, as well-known in the art. Examples of suitable curing agents include polyamines, primary, secondary, and tertiary amines, polyamides, polysulfides, urea-phenol-formaldehyde, and acids or anhydrides thereof. In addition, suitable curing agents include Lewis acid catalysts such as $BF_3$ and complexes thereof.

In the preferred aspects of the present invention the epoxy composition containing the inorganic particulate material is used in combination with reinforcing fibers such as glass fibers. The compositions containing fibers are usually prepared by impregnating the fibers with the above epoxy composition. The amount of the epoxy composition containing the inorganic particulate material when combined with the fibers is usually about 30% to about 70% by weight and preferably, about 55% to about 65% by weight of the total of the solids content of the epoxy composition and the fiber glass.

After combining with the reinforcing fibers, the composition is cured to the B-stage and molded to the desired shape, such as a sheet. When sheets are employed, the thickness is usually about 1.5 mils to about 8 mils, and preferably, about 2 mils to about 3 mils. The curing to the B-stage is generally achieved by using temperatures of about 80° C. to about 110° C. and for times of about 3 minutes to about 10 minutes.

The substrate can then be laminated onto another supporting substrate as is generally practiced in the art. For instance, the bonding of the substrate containing the inorganic particulate material to an underlying substrate for use in integrated circuit modules or high-density circuit boards can be carried out by pressing together a sheet of the substrate containing the inorganic particulate material and a dielectric substrate material such as glass in a preheated laminating press at a predetermined pressure and temperature as, for example, about 200 psi to about 500 psi and preferably, about 250 psi to about 300 psi and at about 180° C. The time of the pressing operation is variable, depending upon the particular materials employed and the pressure applied. About 1 hour is adequate for the above conditions.

One surface of the substrate containing the inorganic particulate material is subjected to an etching process which selectively etches the resinous material in the substrate, leaving inorganic particulate material exposed to thereby produce a roughened surface. The surface topography assumes the features such as particle size and shape of the exposed inorganic particulate material.

The preferred etching processes are the so-called "dry etching processes" such as plasma etching, sputter etching, and reactive ion etching. This eliminates the need of requiring wet chemical processing. The most preferred etching process is a plasma etching process which involves filling an evacuated reaction chamber with a gas whose constituent ions and/or radicals are chemically reactive such as $CF_4$ in admixture with $O_2$. The volume ratio of the $CF_4$ to $O_2$ is usually about 4:96 to about 65:35. The best results, as far as uniformity is concerned, are obtained from volume ratios of $CF_4$ to $O_2$ of about 5:95 to about 60:40. The surface which is to be etched is introduced into the reaction chamber, along with the reactive gas. The reactive gas is usually disassociated, forming radicals, positive ions, and/or negative ions by coupling radio frequency power to the plasma by a capacitive or inductive coupling. It is believed that the disassociated radicals and/or ions then chemically interact with the surface to be etched. In such a process the substrates are positioned either on a ground plane or at the same potential as the plasma gasses.

A typical plasma etching process for a surface area of about 2000 square centimeters per side of substrate can be carried out at a pressure of about 500 millitorr, a total gas flow of 1 standard liter per minute, radio frequency power of 2.5 kilowatts, radio frequency of 13.56 megahertz, and about 5 minutes of on time for the radio frequency.

Using the above conditions, the etch rate of the substrate is usually between about 300 angstroms and about 700 angstroms per minute, while that of the inorganic particulate material is only about 1 angstrom to about 10 angstroms per minute. It is desirable to provide ratios of etch rates of the resinous material to the inorganic particulate material of at least about 100:1, and preferably, at least about 500:1.

In an encapsulated circuit board process, the wires are laid in a photosensitive adhesive, such as one described in U.S. Pat. No. 4,169,732 and the adhesive is cured by exposure to actinic light. This results in firmly bonding the wires to the substrate. Suitable photosensitive compositions comprise:

(a) reaction product of monoethylenically unsaturated carboxylic acid and a bisphenol A-diglycidyl ether epoxide

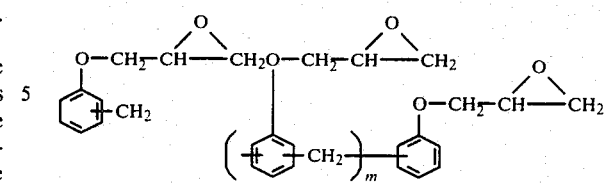

(c) the ratio of a:b is from about 1:4 to about 4:1;
(d) polyethylenically unsaturated compound; and
(e) photo-initiator.

Examples of α,β ethylenically unsaturated carboxylic acid used to provide the above reaction products are acrylic acid, methacrylic acid, and crotonic acid. Component (a), above, can be liquid or solid, depending upon the molecular weight which generally ranges from about $3\times10^2$ to about $10\times10^4$. The n in the above formula 1 generally varies from about 0.2 to about 100, and preferably from about 0.2 to about 25, and most preferably up to about 10.

The relative amounts of monoethylenically unsaturated acid to the diglycidyl ether—bisphenol A epoxide usually employed is sufficient to react stoichiometrically with about 25 to about 100 percent, and preferably about 25 to about 75 percent of the epoxide functionality of this epoxy. The most preferred amount is about 75 percent.

Component (b), above, can be a liquid, semi-solid, or solid, depending upon its molecular weight. Epoxy polymers wherein m is 1.5 to 3.5 are commercially available and are generally suitable.

The relative amount of the monoethylenically unsaturated acid to the epoxidized novolac polymer is such as to react stoichiometrically with from about 25 to about 100 percent of the epoxide functionality of the novolac resin and preferably with about 25 to 75 percent of the epoxide functionality. The most preferred amount is about 75 percent.

The relative amounts between the two epoxy constituents is from about 1:4 to about 4:1, preferably is about 1:3 to about 3:1, and most preferably is about 1:1.

The relative amounts of the combination of epoxides in the composition are generally from about 20 percent to about 75 percent.

The composition may include a relatively minor amount (e.g., up to about 10% of the total epoxy component) of a relatively high molecular weight bisphenol A-epichlorohydrin type polymer or phenoxy polymer of the formula:

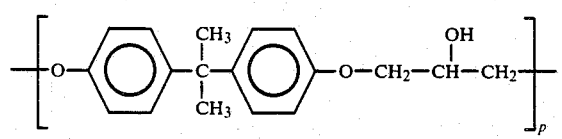

(b) reaction product of a monoethylenically unsaturated carboxylic acid and an epoxidized novolac of the formula:

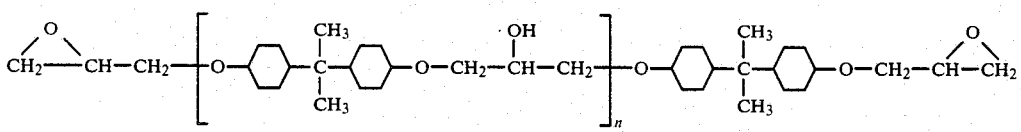

wherein p is usually about 25 to about 100. Some commercially available phenoxypolymers include Eponol 53, Eponol 55, and Epon 1009.

The polyethylenically unsaturated compounds employed in the compositions are capable of reacting upon exposure to ultraviolet light and should contain terminal ethylenic groups. Such compounds include unsaturated esters of polyols and especially esters of the methylene carboxylic acid such as the polyethylene glycol-diacrylates and trimethylol propane triacrylate. The relative amount of the polyethylenically unsaturated compound employed is usually from about 0.5 percent to about 40 percent and preferably from about 1 percent to about 20 percent.

The compositions further include a photo-initiator or sensitizer. Many such materials are well-known to the prior art. Examples of some suitable photo-initiators include anthraquinone and substituted anthraquinones, such as the alkyl substituted or halo substituted anthraquinones including 2-tert-butylanthraquinone. The photo-initiator is employed in amounts sufficient to sensitize the composition to ultraviolet light and is generally from about 0.1 percent to about 10 percent and preferably from about 0.1 percent to about 5 percent.

In addition, the compositions, when desired, can include an organic non-reactive diluent to facilitate the coating operation. Examples of suitable solvents include cellosolve acetate, methyl carbitol, butyl carbitol, methylene chloride, and ketones such as methyl ethyl ketone. When employed, the diluent is present in an amount sufficient to provide compositions having a viscosity between about 100 centistokes and about 1700 centistokes.

The range of light exposure, time, and intensity for a typical photo-processable coating may be ascertained from the following typical conditions:

30 inches from a high-pressure, short-arc, mercury lamp manufactured by OSRAM GMBH, Germany, Model HBO, 500 watts, for a period of about 2 minutes to about 20 minutes.

Concerning an electroless coating process, after the roughening pursuant to the present invention, generally the substrate is then catalyzed by, for instance, a two-step activation procedure using stannous chloride in hydrochloric acid, followed by a dip in palladium chloride in hydrochloric acid or by a one-step procedure employing a tin-palladium hydrosol. In addition, it may be desirable to subject the catalyzed board to an accelerating solution of, for instance, a dilute solution of suitable acid or alkali.

For a discussion of various seeder compositions and processes of applying same, attention is directed to U.S. Pat. Nos. 3,099,608; 3,632,388; and 4,066,809; disclosures of which are incorporated herein by reference.

After sensitization, the desired circuit pattern is defined by conventional photoresist processes. For instance, a negative photosensitive material is applied to the substrate and then, by use of a mask, the photosensitive material is subjected to light of suitable wavelength to cause crosslinking or curing of the photosensitive material. Then, unexposed photosensitive material is removed by treating with a chemical such a methylchloroform in areas where the circuitry is to be plated.

Examples of some photosensitives employed include negative or photohardenable polymerizable compositions of the type suggested in U.S. Pat. Nos. 3,469,982; 3,526,504; 3,867,153; and 3,448,089; and published European Patent Application No. 0049504, disclosures of which are incorporated herein by reference. Polymers from methylmethacrylate and from glycidyl acrylate and/or from a polyacrylate such as trimethylol propane triacylate and pentaerythitol triacrylate are commercially available from E. I. du Pont de Nemours and Company under the trade designation "Riston".

Examples of some negative photosensitive materials employed are from polymethylmethacrylates such as those commercially available from E. I. du Pont de Nemours and Company under the trade designation "Riston T-168". "Riston T-168" is a negative photoresist material from polymethylmethacrylate and cross-linkable monomeric units such as from trimethylol propane triacrylate. A detailed discussion of preparing a negative resist from polymethylmethacrylate, trimethylol propane triacrylate, and trimethylene glycol diacetate can be found in Example 1 of U.S. Pat. No. 3,867,153.

It has been found in accordance with the present invention that the mechanical adhesion of the photoresist to the substrate is significantly improved.

Next, a metal such as copper or nickel is plated onto the substrate in the desired pattern. The metal can be plated by an electroless process. Examples of suitable electroless plating processes can be found in U.S. Pat. Nos. 3,844,799 and 4,152,467, disclosures of which are incorporated herein by reference.

The following non-limiting examples are presented to further illustrate the present invention:

EXAMPLE 1

Glass fibers are impregnated with a composition of 50% solids in methylethylketone of a composition containing about 85 parts by weight of Araldite 8011, about 15 parts by weight of ECN 1299, about 5 parts by weight of benzyldimethylamine, and about 5 parts by weight of Cabosil M-5. Araldite 8011 is a diglycidyl ether of tetrabromo bisphenol A having a weight per epoxide of about 455 to about 500, a melting point of about 70° C. to about 80° C., a bromine content of about 19 to 23 weight percent, is 100% solids, and is available from Ciba Geigy. ECN 1299 is an epoxidized ortho-creosol formaldehyde novolak having a molecular weight of about 1270, a weight per epoxide of about 235, a melting point of about 99° C., an epoxide functionality of about 4.4, and is available from Ciba Geigy. Cabosil M-5 is available from Cabot Corporation, has a surface area of about 200±25 square meters per gram, and are colloidal silica particles sintered together in a chain-like formation. The relative amount of the epoxy composition to the fiberglass is about 60% by weight of the total composition based upon solids.

The prepreg is cured to the B-stage by heating at about 80° C. to about 110° C. for about 6 to 7 minutes.

The B-stage cabosil-filled sheet is laminated onto an epoxide substrate at 300–500 psi pressure, at about 175° C.–180° C. for about one-half hour to about 2 hours to provide a fully cured Cabosil-filled epoxy surface of about 2–3 mils thick. The Cabosil-filled epoxy surface is then etched by a plasma etching process. The composite is placed in a reaction chamber which is then evacuated and filled with a gas containing 5 parts by volume of $CF_4$ and about 95 parts by volume of $O_2$. The pressure in the reaction chamber is about 500 millitorr and the gas is introduced into the reaction chamber at a flow rate of about 1 standard liter per minute. The gas is disassociated by coupling radio frequency power of about 2.5 kilowatts to the plasma and is continued for about 5 minutes.

Adhesive tests are performed by laminating under vacuum, at a temperature of about 76° C., a photosensitive adhesive to the above plasma etched prepreg. The pressure-sensitive adhesive is from a composition prepared in accordance with Example 1 of U.S. Pat. No. 4,169,732 (i.e., up to the disclosure therein concerning exposure), disclosure of which is incorporated herein by reference.

The adhesion tests are performed using a modified Z-axis cross-pull technique. The interface bond is generated by laminating at 76° C. in vacuum so as to produce a cross. The sample is then rigidly mounted on a test fixture. The test fixture is then mounted on a tensile testing machine which measures the load necessary to separate the two perpendicularly laminated strips. The average maximum load from a series of 9 tests is about $6.3 \times 10^2$ Newtons (N) $\pm 0.8 \times 10^2$ N.

COMPARISON EXAMPLE 2

Example 1 is repeated, except that the prepreg is prepared from the same epoxy composition without the presence of the Cabosil and instead of being plasma etched, the surface is roughened by a sacrificial metal layer process including wet chemical etching off of the metal film. The average maximum load for about 10 samples is about $4.0 \times 10^2$ N $\pm 0.5 \times 10^2$ N. The maximum load is somewhat increased when the method of bonding the pressure-sensitive adhesive is a hot-roll laminating process employing a temperature of about 120° C., rather than the vacuum laminating at about 76° C. The results achieved are an average maximum load of about $4.9 \times 10^2$ N $\pm 0.4 \times 10^2$ N.

EXAMPLE 3

Example 1 is repeated, except that the method of bonding the pressure-sensitive adhesive to the etched prepreg is a room temperature high pressure (about 200 psi) technique.

The following results are obtained:
Max. load ($\times 10^2$N)/$3.6 \times 10^2$mm$^2$ sample area
6.4
6.5
7.7

COMPARISON EXAMPLE 4

Example 2 is repeated, except that the method of bonding the pressure-sensitive adhesive to the prepreg is a room temperature high pressure (about 200 psi) process.

The results are as follows:
Max. load ($\times 10^2$N)/$3.6 \times 10^2$mm$^2$ sample area
5.6
6.8

A comparison of the results from Example 3 to those of Example 4 shows that the process of the present invention provides as good as, or better, adhesive bonding characteristics, as achieved by the more complex prior art techniques involving chemical etching.

EXAMPLE 5

A plasma etched prepreg as obtained in Example 1, is immersed into a bath of about 0.05 grams of Reten per 100 ml of an 8% HCl aqueous solution for about 3 minutes. The substrate is then washed with deionized water and dried with air. Next, the coated substrate is immersed in a bath of about 1.5 grams per liter of PdCl$_2$, about 100 grams per liter of SnCl$_2$, and about 280 milliliters per liter of 37% HCl at about 65° F. for about 3 minutes. The substrate is then air-dried. A photoresist, available under the trade designation "Riston T-168", being obtained from polymethylmethacrylate and a cross-linkable monomeric unit, such as trimethylol propane triacrylate, is laminated by a hot-roll laminator at about 110° C. and a pressure of about 10 to about 15 psi. The photoresist is then subjected to imaging radiation through a mask and developed in 1,1,1-trichloroethane.

The substrate is then immersed in a copper electroless additive plating bath for about 20 hours. The electroless plating bath contains about 10 grams per liter of CuSO$_4$·5H$_2$O, 35 grams per liter of ethylene diamine tetraacetic acid dihydrate, 0.25 grams per liter of GAFAC RE-610, 14 milligrams per liter of sodium cyanide, and 2 milliliters per gram of 37% aqueous HCHO. The specific gravity of the plating bath is about 1.07, the pH is about 11.7 by the addition of NaOH, and the temperature of the bath is about 73° C. $\pm$5° C. The oxygen content of the bath is maintained at about 2.5 ppm to about 3.5 ppm. The gas flow rate is about 12 SCFM. In addition, the plating racks are continuously agitated during the plating.

After the plating, the remaining photoresist is stripped by dissolving in methylene chloride.

The peel strength of the copper plating, as tested with a tensile testing machine, is about 1.5 grams/mil of line width of adhesion; whereas, the specification of the peel strength for commercial purposes is only 1 gram/mil of line width. Peel strengths for certain optimized sacrificial metal techniques of about 3 grams/mil have been achieved, but such optimized techniques are much more complex and costly to carry out.

Having thus described our invention, what we claim as new and desire to secure by Letters Patent is:

1. A method of improving the adhesion between a photosensitive adhesive and a dielectric substrate which comprises roughening the surface of said dielectric substrate by:
   providing a substrate comprising a resinous material and inorganic particulate material;
   etching a surface of said substrate which selectively etches said resinous material to thereby provide a roughened surface; and
   then coating a photosensitive adhesive onto said roughened surface.

2. The method of claim 1 wherein said resinous material comprises an epoxy resin.

3. The method of claim 1 wherein said inorganic particulate material is selected from the group of SiO$_2$, CaCO$_3$, Al$_2$O$_3$, CaO$_2$, SiC, CaF$_2$, and mixtures thereof.

4. The method of claim 1 wherein said inorganic particulate material comprises silica.

5. The method of claim 1 wherein said inorganic particulate material is an aggregate of fused spherical particles having an aggregate size of about 0.002 to about 10 microns.

6. The method of claim 5 wherein said aggregate size is about 0.1 to about 1 micron.

7. The method of claim 1 wherein the amount of said inorganic particulate material is about 1% to about 10% by weight based upon the total of said resinous material and inorganic particulate material.

8. The method of claim 1 wherein the amount of said inorganic particulate material is about 4% to about 8% by weight of the total of said resinous material and inorganic particulate material.

9. The method of claim 1 wherein said substrate also contains reinforcing fibers.

10. The method of claim 1 wherein said reinforcing fibers are glass fibers.

11. The method of claim 8 wherein the amount of the combination of resinous material and inorganic particulate material is about 30% to about 70% by weight of the total of the resinous material, inorganic particulate material, and reinforcing fibers.

12. The method of claim 8 wherein said amount is about 55% to about 65% by weight.

13. The method of claim 1 wherein said etching is a dry etching process.

14. The method of claim 1 wherein said etching is a plasma etching process.

15. The method of claim 14 wherein said plasma etching employs a gas containing $CF_4$ and $O_2$ in a ratio of about 4:96 to about 65:35 by volume.

16. The method of claim 1 which further comprises catalyzing the roughened surface for subsequent deposition of copper from an electroless plating bath.

17. The method of claim 1 wherein said photosensitive adhesive is a negative photosensitive adhesive.

18. The method of claim 17 wherein said negative photosensitive adhesive is a polymer from methylmethacrylate.

19. The method of claim 17 wherein said resinous material comprises an epoxy resin.

* * * * *

UNITED STATES PATENT AND TRADEMARK OFFICE
CERTIFICATE OF CORRECTION

PATENT NO. : 4,615,763

DATED : October 7, 1986

INVENTOR(S) : Gelorme, et al.

It is certified that error appears in the above-identified patent and that said Letters Patent is hereby corrected as shown below:

Column 5, line 59, delete the term "novolac" and insert therefor the word -- novolak --.

Column 6, lines 34 and 36, delete the term "novolac" and insert therefor the word -- novolak --.

Signed and Sealed this

Twenty-fifth Day of August, 1987

Attest:

DONALD J. QUIGG

Attesting Officer

Commissioner of Patents and Trademarks